United States Patent
Lee

(10) Patent No.: US 11,227,647 B2
(45) Date of Patent: *Jan. 18, 2022

(54) SEMICONDUCTOR DEVICE

(71) Applicant: Samsung Electronics Co., Ltd., Suwon-si (KR)

(72) Inventor: Sang Kil Lee, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/106,242

(22) Filed: Nov. 30, 2020

(65) Prior Publication Data

US 2021/0098043 A1   Apr. 1, 2021

Related U.S. Application Data

(63) Continuation of application No. 16/439,924, filed on Jun. 13, 2019, now Pat. No. 10,878,873.

(30) Foreign Application Priority Data

Oct. 19, 2018   (KR) .................. 10-2018-0124880

(51) Int. Cl.
| | |
|---|---|
| *G11C 11/16* | (2006.01) |
| *G06F 12/00* | (2006.01) |
| *G06F 12/02* | (2006.01) |
| *G11C 14/00* | (2006.01) |
| *G11C 16/10* | (2006.01) |
| *G11C 11/02* | (2006.01) |
| *H01L 27/22* | (2006.01) |
| *H01L 43/08* | (2006.01) |
| *H01L 43/02* | (2006.01) |
| *G06F 16/25* | (2019.01) |

(Continued)

(52) U.S. Cl.
CPC ...... *G11C 11/1677* (2013.01); *G11C 11/1673* (2013.01); *G11C 11/1675* (2013.01); *G11C 14/0081* (2013.01); *H01L 27/228* (2013.01); *H01L 43/02* (2013.01); *H01L 43/08* (2013.01); *G06F 16/00* (2019.01); *G06F 16/258* (2019.01); *G06F 16/283* (2019.01)

(58) Field of Classification Search
CPC ............ G11C 11/1677; G11C 11/1673; G11C 11/1675; G11C 14/0081; H01L 27/228; H01L 43/02; H01L 43/08; G06F 16/258; G06F 16/283; G06F 16/00
USPC ......................................... 365/158
See application file for complete search history.

(56) References Cited

U.S. PATENT DOCUMENTS

| 8,396,937 B1 | 3/2013 | O'Krafka et al. |
| 9,213,495 B2 | 12/2015 | Asnaashar et al. |

(Continued)

FOREIGN PATENT DOCUMENTS

KR   101391270 B1   5/2014

*Primary Examiner* — Ly D Pham
(74) *Attorney, Agent, or Firm* — Muir Patent Law, PLLC

(57) ABSTRACT

A semiconductor device is provided. The semiconductor device includes: a processor core which processes program data; a first memory mounted on the same semiconductor chip as the processor core; a second memory including an MRAM cell having a first MTJ (Magnetic Tunnel Junction) structure; a third memory including an MRAM cell having a second MTJ structure different from the first MTJ structure, wherein the processor core selectively stores the program data in one of the first memory, the second memory and the third memory, on the basis of an attribute of the program data.

20 Claims, 10 Drawing Sheets

(51) Int. Cl.
    *G06F 16/00*     (2019.01)
    *G06F 16/28*     (2019.01)

(56) References Cited

U.S. PATENT DOCUMENTS

| | | |
|---|---|---|
| 9,997,225 B2 | 6/2018 | Datta et al. |
| 10,379,784 B1 | 8/2019 | Sethuraman et al. |
| 10,649,665 B2 | 5/2020 | Confalonieri et al. |
| 2005/0223136 A1 | 10/2005 | Tanaka et al. |
| 2008/0001960 A1 | 1/2008 | Chen |
| 2008/0082558 A1 | 4/2008 | Uno |
| 2010/0161308 A1 | 6/2010 | Norman |
| 2012/0191900 A1 | 7/2012 | Kunimatsu et al. |
| 2014/0146589 A1 | 5/2014 | Park et al. |
| 2015/0106602 A1 | 4/2015 | Greathouse et al. |
| 2015/0134892 A1 | 5/2015 | Goda |
| 2016/0320994 A1 | 11/2016 | Chun et al. |
| 2017/0345475 A1 | 11/2017 | Lee et al. |
| 2018/0007540 A1 | 1/2018 | Song et al. |
| 2018/0081820 A1 | 3/2018 | Noguchi et al. |
| 2018/0136979 A1 | 5/2018 | Morris |
| 2018/0341423 A1 | 11/2018 | Hori |
| 2019/0102089 A1 | 4/2019 | Ober et al. |

|  | Operation Type | Memory Occupancy |
|---|---|---|
| Code | Read Only (RO) | 15x |
| Heap | Read↑/Write↓ (RI) | 20x |
| Stack | Read↓/Write↑ (WI) | 1x |

SEMICONDUCTOR DEVICE

This application is a continuation of U.S. patent application Ser. No. 16/439,924, filed Jun. 13, 2019, in the U.S. Patent and Trademark Office, which claims the benefit of priority under 35 U.S.C. § 119 to Korean Patent Application No. 10-2018-0124880, filed on Oct. 19, 2018, the entire contents of both of which are incorporated herein by reference.

BACKGROUND

1. Field of the Invention

The present disclosure relates to a semiconductor device. More specifically, the present disclosure relates to a semiconductor device that selectively stores program data in different types of memories, based on attributes of program data.

2. Description of the Related Art

Various electronic devices are widely used. These electronic devices perform various functions, using electrical signals and electronically stored data. The electronic devices include processors for processing signals and data. Furthermore, the electronic devices include memory for storing data.

Along with the development of design technology and process technology, electronic devices having small sizes are being produced. Small electronic devices, such as laptop computers, mobile terminals, and cellular phones, may be carried and easily conveyed by a user. Recently, wearable electronic devices attached to the user's body have been developed.

Also, the use of IoT (Internet of Things) electronic devices operating in IoT environments has gradually increased, and the use of home appliances remotely controlled by an external device has also increased accordingly.

Wearable electronic devices or IoT electronic devices are manufactured to have a smaller size for the convenience of the user. When the size of the electronic device decreases, the size of the integrated circuit chip included in the electronic device also needs to be reduced. Furthermore, if the size of the electronic device decreases, an amount of total power supplied by a power supply device such as a battery is also reduced.

As an example, a small electronic device may include a buffer memory for temporarily buffering data processed or to be processed by a processor, and a non-volatile memory for storing data, irrespective of supply of a power source. Incidentally, the wearable electronic devices and the IoT devices may perform more functions that require a smaller amount of computation than functions that require a large amount of computation. Accordingly, the wearable electronic device or the IoT device may include a buffer memory having a large buffer capacity. Furthermore, memories that leak large amounts of power are not suitable for the wearable electronic device or the IoT device.

SUMMARY

Aspects of the present invention provide to provide a semiconductor device that may improve input/output efficiency of data and improve power efficiency, by determining data to be stored in different types of memories on the basis of attributes of data.

Aspects of the present invention also provide a semiconductor device that satisfies miniaturization of the MCU, by mounting a plurality of different memories on a single semiconductor chip and determining a memory in which data is stored on the basis of attributes of data.

According to some embodiments, the disclosure is directed to a semiconductor device comprising: a processor core mounted on a semiconductor chip and configured to process program data; a first memory mounted on the semiconductor chip; a second memory including a magnetoresistive random access memory (MRAM) cell having a first Magnetic Tunnel Junction (MTJ) structure; a third memory including an MRAM cell having a second MTJ structure different from the first MTJ structure, wherein the processor core selectively stores the program data in one of the first memory, the second memory, and the third memory based on an attribute of the program data.

According to some embodiments, the disclosure is directed to a semiconductor device comprising: a processor core configured to process program data; a first memory including a first MTJ structure; and a second memory including a second MTJ structure having a height different from the first MTJ structure, wherein the processor core is further configured to read first data stored in the first memory, generate second data on the basis of the first data, store the second data in the second memory, and execute a program operation using the first data and the second data.

According to some embodiments, the disclosure is directed to a semiconductor device comprising: a processor core mounted on a first semiconductor chip and configured to execute a program operation; a first memory mounted on the first semiconductor chip and configured to store data used for the program operation; a second memory mounted on the first semiconductor chip and having a memory cell of a type different from a memory cell included in the first memory; and a third memory mounted on the first semiconductor chip and including a memory cell of the same type as a memory cell included in the second memory, wherein the processor core is further configured to selectively determine a memory in which data is stored based on a range of a virtual address region allocated to data used for the program operation.

However, aspects of the present invention are not restricted to the one set forth herein. The above and other aspects of the present invention will become more apparent to one of ordinary skill in the art to which the present invention pertains by referencing the detailed description of the present invention given below.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION

Hereinafter, a semiconductor device according to some embodiments of the technical idea of the present invention will be described with reference to FIGS. 1 to 12.

Figure 1:
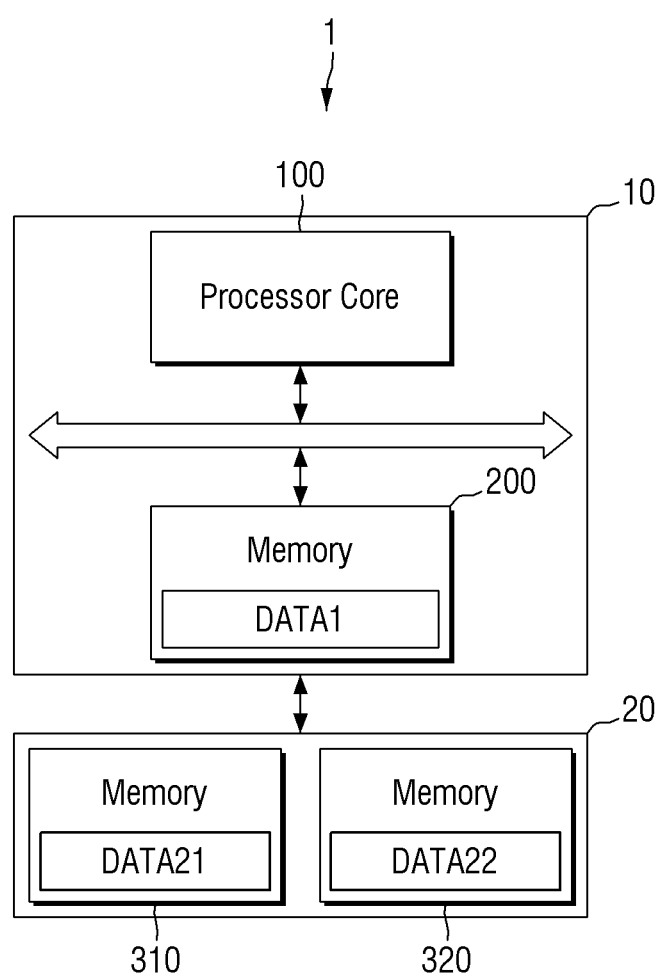
FIG. 1 is a block diagram of a semiconductor device including two MRAMs, according to an example embodiment.

FIG. 1 is a block diagram of the semiconductor device including two MRAMs, according to an example embodiment.

Referring to FIG. 1, a semiconductor device 1 according to an example embodiment may include a first semiconductor chip 10 and a second semiconductor chip 20. In addition, the first semiconductor chip 10 may include a processor core 100 and a first memory 200, and the second semiconductor chip 20 may include a second memory 310 and a third memory 320.

According to the embodiment, the processor core 100 may include one or more processor cores. The processor core 100 may process data and signals. The semiconductor device 1 may execute functions, using the processed data and signals. According to the embodiment, the processor core 100 may be an application processor.

According to the embodiment, the first memory 200 may be a SRAM (Static Random Access Memory). The SRAM may operate at a higher speed than a DRAM (Dynamic Random Access Memory). When the SRAM is mounted on the first semiconductor chip 10, a semiconductor device 1 having a small size and capable of operating at high speed may be obtained. Furthermore, when the SRAM is mounted on the first semiconductor chip 10, the consumption of the operating power (Active Power) of the semiconductor device 1 may be reduced. However, the first memory 200 is not limited to the SRAM, but may be implemented as various types of random access memories.

According to the embodiment, the second memory 310 and the third memory 320 each may be a MRAM (Magneto-Resistive Random Access Memory). The MRAM has a higher degree of integration (density) and has a lower power leakage characteristic than the SRAM. Therefore, when the MRAM is disposed in the semiconductor device 1, a memory having a larger capacity than the SRAM may be obtained. Furthermore, when the MRAM is disposed in the semiconductor device 1, a semiconductor device 1 that consumes less power may be obtained.

According to the embodiment, the first data DATA1, the second data DATA21 and the third data DATA22 may be drive data. For example, the first memory 200, the second memory 310 and the third memory 320 may load the drive data. The drive data is data used to drive hardware and software. According to the embodiment, the drive data may include data relating to an operating system. According to the embodiment, the drive data may include data relating to a preloaded application (e.g., a software application loaded on the semiconductor device 1). For example, the preloaded application may be an application for controlling communication with and within the semiconductor device 1, an application for managing power of the semiconductor device 1, or the like.

The processor core 100 determines the attributes of the program data used for the program operation, and may allocate the memory in which the program data is stored, among the first memory 200, the second memory 310 and the third memory 320, on the basis of the determined attributes of the program data. The process of determining the attributes of the program data, storing the program data based on the attributes of the program data, and executing the program operation using the data of the program will be described later with reference to FIGS. 4 to 6.

According to some embodiments, the semiconductor device 1 may further include a storage region (not illustrated) for storing the user data. For example, the user data may include data relating to the application downloaded by the user. Alternatively, the user data may include data relating to documents or media provided from the user. As another example, the user data may be stored in the first memory 200, the second memory 310, and the third memory 320.

According to some embodiments, the second memory 310 and the third memory 320 included in the second semiconductor chip 20 may be physically partitioned regions, respectively. In this case, each of the memory regions included in the second semiconductor chip 20 may execute unique functions within the partitioned physical region.

The processor core 100, the first memory 200, the second memory 310 and the third memory 320 may transfer data based on various interface rules. For example, the processor core 100, the first memory 200, the second memory 310, and the third memory 320 may transfer data, on the basis of interface rule of one or more of a universal serial bus (USB), a small computer system interface (SCSI), a peripheral component interconnect (PCI) Express, an advanced technology attachment (ATA), a parallel ATA (PATA), a serial ATA (ATA), a serial attached SCSI (SAS), an integrated drive electronics (IDE), and an universal flash storage data (UFS).

Figure 2:
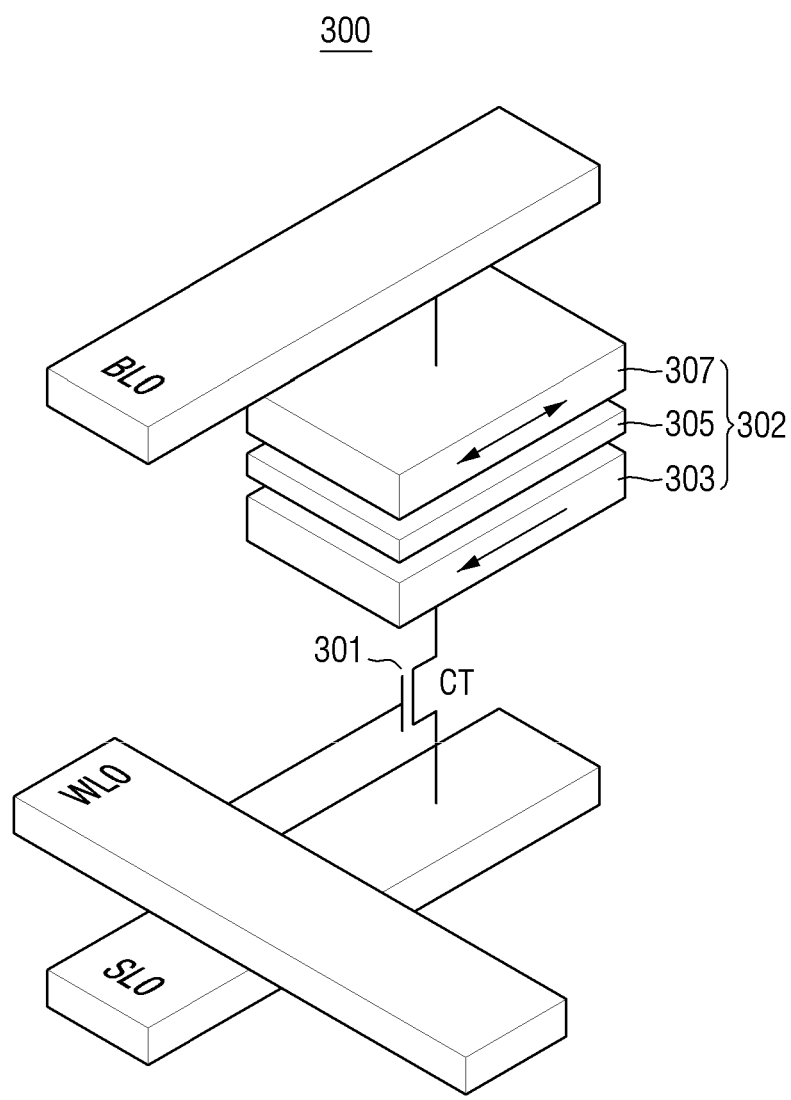
FIG. 2 is a schematic view three-dimensionally illustrating a cell structure of an example MRAM.

FIG. 2 is a schematic view three-dimensionally illustrating the cell structure of the MRAM. Referring to FIG. 2, as a memory cell of a non-volatile RAM, a memory cell of a spin transfer torque type MRAM (Spin Transfer Torque Magneto resistive Random Access Memory, hereinafter referred to as an STT-MRAM) is illustrated. The memory cell may include a magnetic tunnel junction (hereinafter, a MTJ element) 302 and a cell transistor (CT) 301. A word line WL0 may be connected to the gate of the cell transistor 301. Further, one end of the cell transistor 301 is connected to a bit line BL0 via the MTJ element 302. Further, the other end of the cell transistor 301 is connected to a source line SL0.

The MTJ element 302 may include a pinned layer 303, a free layer 307, and a tunnel layer 305 positioned therebetween. A magnetization direction of the pinned layer 303 is fixed, and a magnetization direction of the free layer 307 may be the same as or opposite to the magnetization direction of the pinned layer 303 depending on the conditions. For example, an anti-ferromagnetic layer (not illustrated) may be further provided to fix the magnetization direction of the pinned layer 303.

In order to perform a write operation of the MRAM 300, a voltage is applied to the word line WL0 to turn on the cell transistor 301, and the write current is applied between the bit line BL0 and the source line SL0. In order to perform a read operation of the MRAM 300, a turn-on voltage is applied to the word line WL0 to turn on the cell transistor 301, and a reading current may be applied in the direction from the bit line BL0 to the source line SL0 to discriminate the data stored in the MTJ cell 302 depending on the measured resistance value.

Figure 3A:
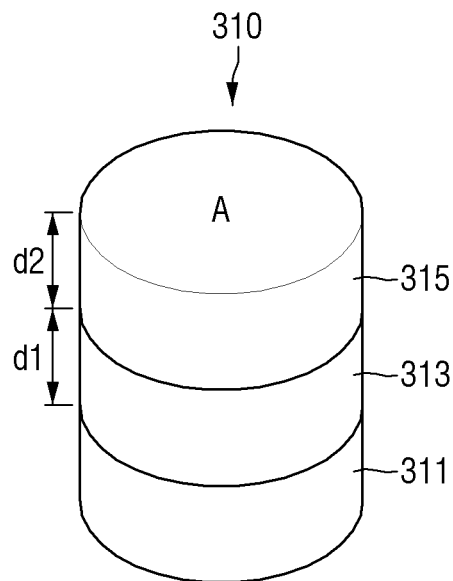
FIGS. 3a to 3d are views illustrating an MTJ structure for determining characteristics of the MRAM, according to an example embodiment.

Referring to FIG. 3a, the second memory 310 of FIG. 1 may include a pinned layer 311, a tunnel layer 313 having a first thickness d1, and a free layer 315 having a second thickness d2. Further, each of the pinned layer 311, the tunnel layer 313, and the free layer 315 has a cross-sectional area of a size A. According to an example embodiment, the second memory 310 may be configured as an MRAM having NOR flash characteristic, by adjusting the thickness of the tunnel layer 313, the thickness of the free layer 315, and/or the cross-sectional area of the MTJ structure. For example, the second memory 310 may be configured as an MRAM having retention of 10 years and durability of $10^6$. At this time, the durability may mean the number of times data is written to the MRAM cell.

Figure 3B:
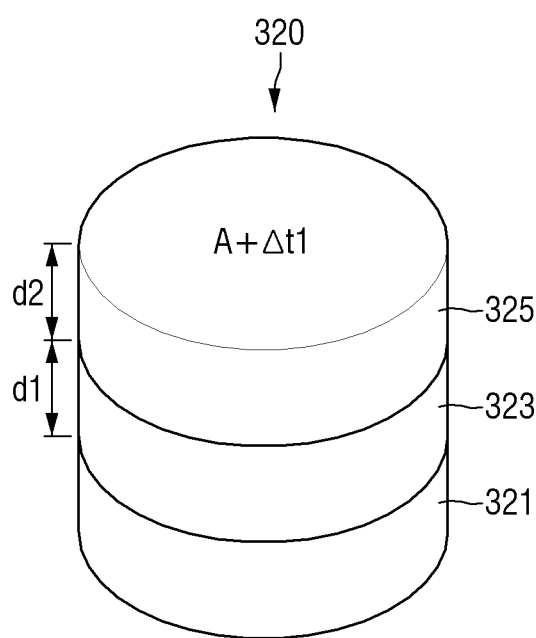

Referring to FIG. 3b, the third memory 320 of FIG. 1 may include a pinned layer 321, a tunnel layer 323 having a first thickness d1, and a free layer 325 having a second thickness d2. In addition, the cross-sectional area of the pinned layer 321, the tunnel layer 323 and the free layer 325 may be formed to have a size that is A+Δt1. For example, the third memory 320 may include an MTJ cell having a cross-sectional area larger than the second memory 310, and may improve durability by increasing the cross-sectional area. For example, the third memory 320 may be configured as a MRAM having durability of $10^{12}$. According to an example embodiment, the third memory 320 may be configured as an MRAM having characteristics of SRAM in terms of retention and durability.

Figure 3C:
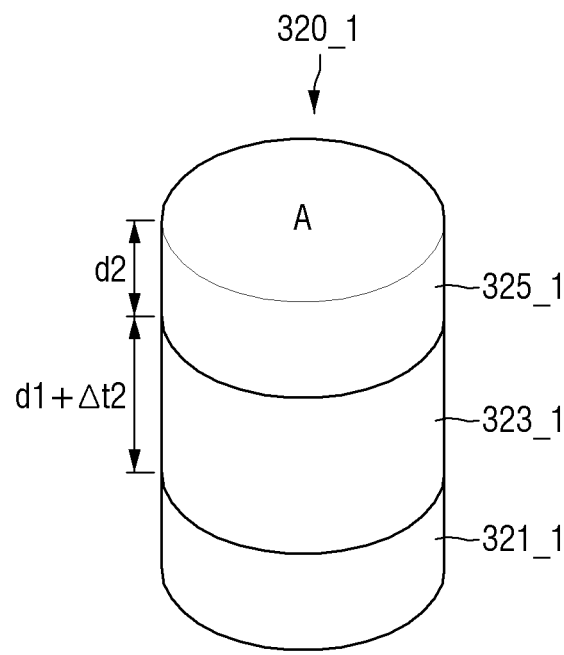

Referring to FIG. 3c, a fourth memory 320_1 includes a pinned layer 321_1, a tunnel layer 323_1 having a third thickness d1+Δt2, and a free layer 325_1 having a second thickness d2, and the cross-sectional areas of the pinned layer 321_1, the tunnel layer 323_1, and the free layer 325_1 are formed to have a size A. For example, the fourth memory 320_1 may include an MTJ cell having a thickness of the tunnel layer 323_1 greater than the second memory 310, and may be implemented as an MRAM having improved durability over the second memory 310 by increasing the thickness of the tunnel layer 323_1 by Δt2. According to the embodiment, the fourth memory 320_1 may be configured as an MRAM having characteristics of SRAM in terms of retention and durability. According to an example embodiment, the third memory 320 of FIG. 1 may be implemented as a fourth memory 320_1.

Figure 3D:
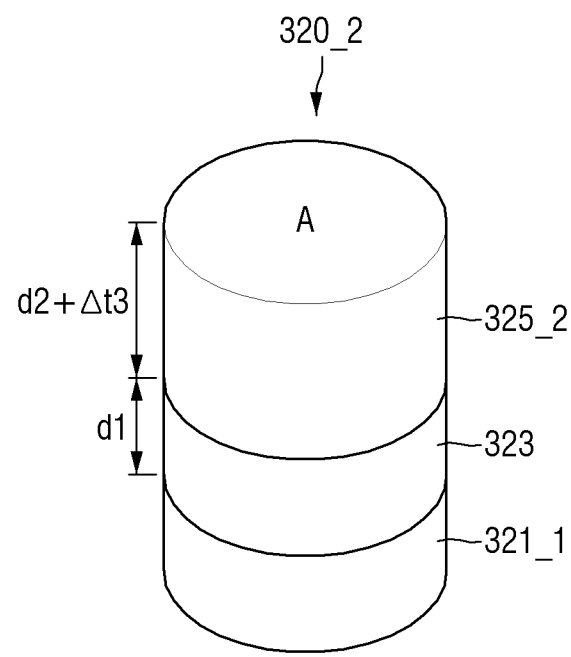

Referring to FIG. 3d, a fifth memory 320_2 includes a pinned layer 321_1, a tunnel layer 323 having a first thickness d1, and a free layer having a fourth thickness d2+Δt3, and the cross-sectional areas of the pinned layer 321_1, the tunnel layer 323, and the free layer 325_2 are formed to have a size A. For example, the fifth memory 320_2 may include an MTJ cell having a thickness of the free layer 325_2 greater than the second memory 310, and may be implemented as an MRAM having improved durability over the second memory 310 by increasing the thickness of the free layer 325_2 by Δt3. According to the embodiment, the fifth memory 320_2 may be configured as an MRAM having characteristics of SRAM in terms of retention and durability. According to an example embodiment, the third memory 320 of FIG. 1 may be implemented as a fifth memory 320_2.

Figure 4:
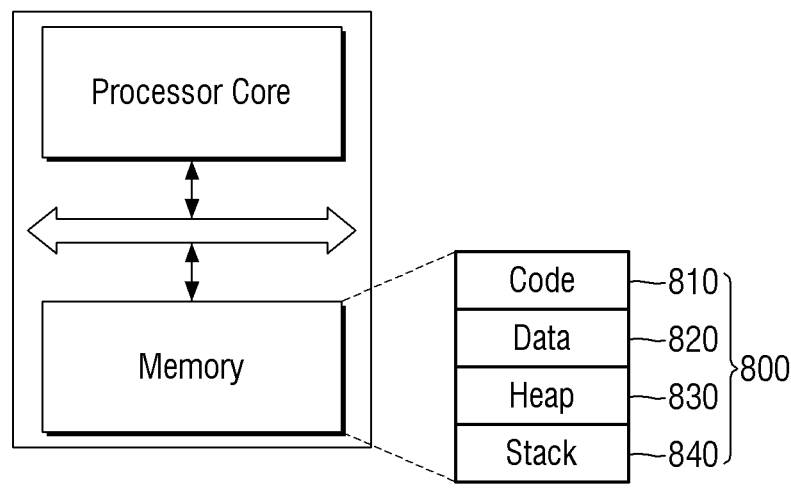
FIGS. 4 and 5 are diagrams illustrating a structure of an operating system memory, according to an example embodiment.
Figure 5:
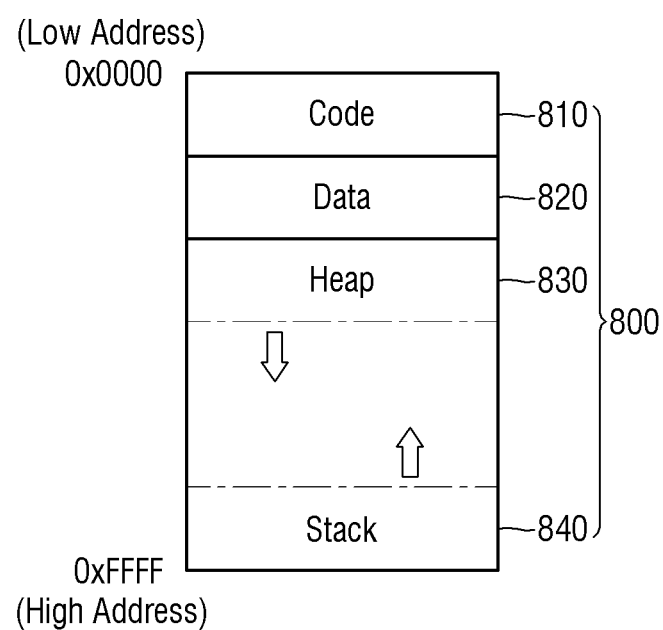

FIGS. 4 and 5 are diagrams illustrating the structure of the operating system memory according to an example embodiment.

In an IoT environment, an operating system memory 800 of a low-end electronic device may include a code region (Code) 810, a data region (Data) 820, a heap region (Heap) 830, and a stack region (Stack) 840. Such regions may be dispersed and distributed in a plurality of storages, and may be handled, managed and operated as if they are a single storage according to a single address space system.

Referring to FIG. 4, the actual placement may differ somewhat depending on the operating system, but the existence and purpose of each such region are applied in the same way. Since all the tasks during the kernel and the program execution in a single address space may conceptually be accessed to the whole memory, they have a structure that shares the code region 810, the data region 820, the heap region 830, and the stack region 840. For convenience of explanation, it has been illustrated that a single address space is allocated to a single memory, but this may be a virtual address space, and the address corresponding to each region may be allocated to physically separated memory.

As illustrated in FIG. 5, the memory region operated according to a single address space system may be divided into a code region 810, a data region 820, a heap region 830, and a stack region 840 from a lower address (0x0000) to upper address (0xFFFF). Such a memory structure is one example, and memory structures may be configured in other forms. The code region 810 is a region in which program commands are located and controlled by a machine language. The data region 820 is a region that is generated at the time of execution of program (e.g., during program execution) and is returned to the system when the program ends, and in which global variables, static variables, an array, a structure, and the like are stored. The heap region 830 is a region to which memory is dynamically allocated when the program is loaded. The stack region 840 is a temporary memory region automatically used by the program. Specifically, the stack region 840 is a region which stores data, such as local variables, parameters, and a return value, that are used for a while and then disappear, and the stack region 840 is generated at the time of calling the function and is returned to the system when the function ends.

As applications executed in the IoT-based electronic devices diversify and additional functions such as voice recognition and image recognition increase, the memory required for electronic devices tends to continuously increase. An MCU (microcontroller unit) utilized by being provided in the IoT-based electronic device does not include a cache and tends to implement a built-in memory as an SRAM. However, when the capacity of the memory required for the MCU increases due to the reasons mentioned above and the capacity of the memory increases, there is a problem that most of the space of the MCU is filled with the built-in memory (for example, SRAM). In order to satisfy the required memory capacity, the chip size of the MCU is increased. In this case, there is a problem that the cost of the MCU increases and the miniaturization is hindered. Therefore, there is a need for a structure of a semiconductor device (or a semiconductor chip) which satisfies the requirement for increasing the memory capacity and may minimize the increasing size of the MCU and the increase in power consumption at the same time.

Referring to FIGS. 1 and 5, according to some embodiments, a processor core 100 may allocate a virtual address (0x0000 to 0xFFFF) of a region in which data is stored, may determine the attributes of the program data on the basis of the virtual address range to be allocated to the program data, and may determine the memory in which the program data is stored on the basis of the attributes of the program data. Specifically, the processor core 100 may set address ranges of each of the code region 810, the data region 820, the heap region 830, and the stack region 840, and may determine the memory in which the program data is stored, on the basis of the address range corresponding to specific addresses in which the program data is stored. According to an example embodiment, program data corresponding to the address range allocated to the code region 810 or the data region 820 may be stored in the second memory 310, program data corresponding to the address range allocated to the stack region 840 may be stored in the first memory 200, and program data corresponding to the address range assigned to the heap region 830 may be stored in the third memory 320.

When determining the memory in which the program data is stored based on the address range, by storing the data in the memory having the operation characteristic suitable for the attribute of the data stored in each address range, the effective input/output operation of data may be executed, and power consumption may be reduced accordingly. The input/output characteristics of the data stored in each region will be described below with reference to FIG. 6.

Figures 6, 7:
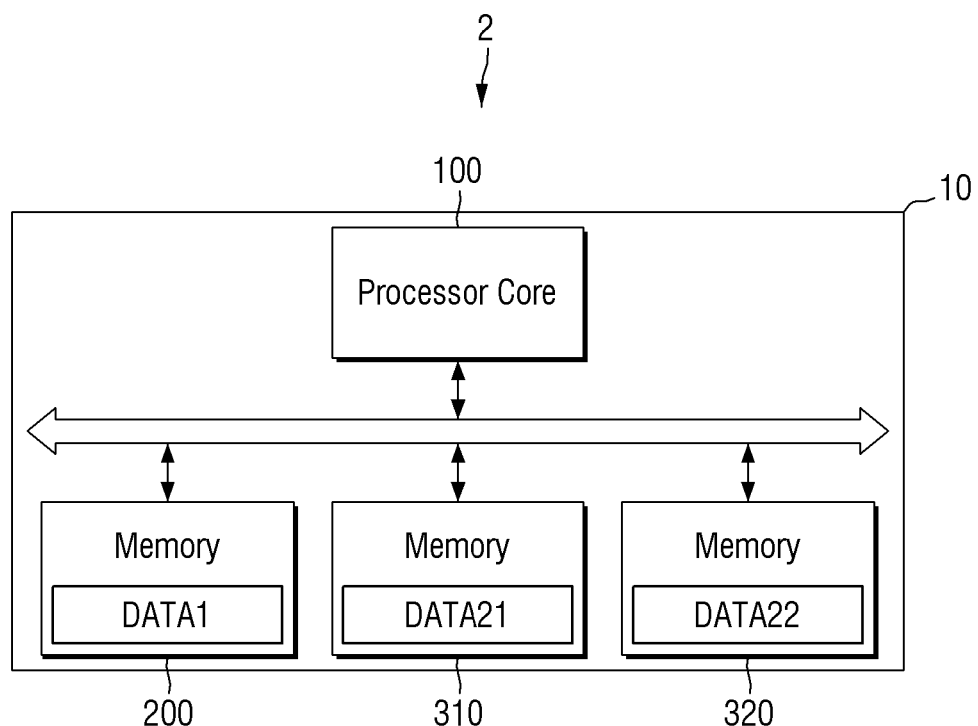
FIG. 6 is a diagram illustrating example read/write attributes and memory occupation attributes according to the attribute of the program data.
FIG. 7 is a block diagram of a semiconductor device in which an SRAM and two MRAMs are mounted on a single semiconductor chip, according to an example embodiment.

FIG. 6 is a diagram illustrating the read/write attribute and the memory occupation attribute according to the attribute of the program data. An operation of determining a memory in which program data is stored based on attributes of program data will be described with reference to FIGS. 1 and 6, according to an example embodiment.

Among program data necessary for driving a program such as an OS and an application, data stored in a code region has an operation type of RO (Read Only), data stored in a heap region has an operation type of RI (Read Intensive), and data stored in the stack region has an operation type of WI (Write Intensive). For example, since the code region having the program command stored therein is generated at the time of the initial generation of the program and then is read at the time of execution of the program operation to drive the program, the code region has an operation type of RO. Since the heap region dynamically allocated at the time of loading of program has the read operation frequently occurring, it has an operation type of RI. And because the code region for storing the data in which the local variable or the like is used for a while and then disappears, the write operation occurs more frequently, and it has an operation type of WI. Also, as for a ratio in which each region occupies the memory, with reference to a size of the stack region, the code region occupies capacity of 15 times the size of the stack region, and the heap region occupies capacity of 20 times the stack region. When the data stored in the code region, the heap region, and the stack region increases, in the case of storing all the program data in the same memory (for example, SRAM) of the IoT device, there can be an issue that the size of the memory increases, and the size of the image consequentially increases.

According to some example embodiments, the processor core 100 may decide the attribute of program data as either RW (Read/Write) data or RO (Read Only) data, and may determine the data in which the program data is stored on the basis of the attributes of the decided program data. At this time, the RW data may include RI (Read Intensive) data having a high read operation ratio, and WI (Write Intensive) data having a high write operation ratio. Specifically, the program data decided as the RW data is stored in the first memory 200, and the program data decided as the RO data may be selectively stored in the second memory 310 or the third memory 320. For example, the RW data in which the read operation and the write operation frequently occur is stored in the first memory 200 configured as the SRAM having a relatively high operation speed, and the RO data is stored in the second memory 310 or the third memory 320, thereby making it possible to efficiently use the memory. According to the embodiment, the data decided as RO may be stored in the second memory 310 having the NOR flash characteristic, thereby making it possible to reduce the proportion of the RO data stored in the SRAM to prevent an increase in the SRAM size.

According to some embodiments, the processor core 100 may decide the attribute of the program data as one of WI data, RO data, or RI data, and may determine the memory in which the program data is stored based on the decided attributes of the program data. Specifically, the program data decided as WI data may be stored in the first memory 200, the program data decided as RO data may be stored in the second memory 310, and the program decided as RI data may be stored in the third memory 320. For example, the WI data in which the write operation frequently occurs and a ratio of occupying the memory is low is stored in the first memory 200 configured as an SRAM having a high operation speed, and the RO data is stored in the second memory 310 which is MRAM having the NOR flash characteristics, thereby preventing an increase in the size of the SRAM. Further, the RI data is stored in the third memory 320 which is the MRAM having the SRAM characteristics, thereby making it possible to quickly process the write operation and prevent an increase in the size of the SRAM.

According to some example embodiments, the processor core 100 may decide the attributes of the program data as one of the stack data, the code data, and the heap data, and may determine the data in which the program data is stored based on the decided attributes of the program data. At this time, the stack data, the code data, and the heap data may mean data to be stored in each of the stack region 840, the code region 810, and the heap region 810, respectively, of FIG. 5. According to an example embodiment, the code data may include data stored in the data region 820 of FIG. 5. According to an example embodiment, the processor core 100 may perform the control such that program data is stored in the first memory 200 when the program data is decided as a stack data, the program data is stored in the second memory 310 when the program data is decided as a code data, and the program data is stored in the third memory 320 when the program data is decided as a heap data.

In the program operation such as an application implemented in the IOT device, since the code region has the RO operation characteristics and has a proportion occupying in the memory region reaching approximately 42%, the code region is replaced with an MRAM (the second memory 310 of FIG. 1) having the NOR flash characteristic to reduce the size and power consumption of the MCU. In the stack region to which the memory region is allocated by the OS at the compile stage, the write operation frequently occurs and the required memory space is 3% level of the entire memory space, and an influence on the increase in SRAM size is small even when using the existing SRAM. Thus, the stack region is stored in the SRAM (the first memory 200 of FIG. 1) in the semiconductor chip on which the processor core 110 is mounted. Since the heap region dynamically allocated by a user (or a programmer) has not many write operations and has a high proportion occupying in the memory region of about 55%, by storing the program data to be stored in the heat region in the MRAM (the third memory 320 of FIG. 1), it is possible to expect miniaturization of the MCU and power consumption saving effect.

FIG. 7 is a block diagram of a semiconductor device in which an SRAM and two MRAMs are mounted on a single semiconductor chip according to an example embodiment.

Referring to FIG. 7, a semiconductor device 2 according to an example embodiment may include a processor core 100 mounted on the first semiconductor chip 10 to process the program data, and a first memory 200, a second memory 310, and a third memory 320 each mounted on the semiconductor chip 10. The first memory 200, the second memory 310, and the third memory 320 of FIG. 7 may be configured to be the same as the first memory 200, the second memory 310 and the third memory 320, respectively. Further, the operation of the semiconductor device 1 described above with reference to FIGS. 1 to 6 may be similarly applied to the semiconductor device 2 of FIG. 7.

According to an example embodiment, the second memory 310 and the third memory 320 may be a MRAM (Magneto-Resistive Random Access Memory). The MRAM has a higher degree of integration (density) and a lower power leakage characteristic than the SRAM. Therefore, when the MRAM is mounted on the first semiconductor chip 10, a built-in memory having a large capacity may be obtained, and the storage capacity of the same size and the same capacity can be obtained as compared to a case where the built-in memory is configured as only the SRAM. Furthermore, when the MRAM is mounted on the first semiconductor chip 10, it is possible to obtain a semiconductor device 2 that consumes less electric power.

When the second memory 310 shares a die with the processor core 100 (e.g., a part of the drive memory is mounted on the first semiconductor chip 10), the length of the input/output channel for transmitting the second data DATA21 between the processor core 100 and the second memory 310 becomes shorter, and the input/output logic and the driver for controlling the input and output of the second data DATA21 may be removed. Therefore, the amount of power consumed for transmission of the second data DATA21 may be reduced. Furthermore, the time required for transmitting the second data DATA21 may be shortened, thereby reducing the total amount of energy consumed by the semiconductor device 2.

Similarly, when the third memory 320 shares a die with the processor core 100, the length of the input/output channel for transmitting the third data DATA22 between the processor core 100 and the third memory 320 may be shortened, and the input/output logic and the driver for controlling the input and output of the third data DATA22 may be removed. Therefore, the amount of power consumed for transmission of the third data DATA22 may be reduced. Furthermore, the time required for transmission of the third data DATA22 may be reduced, thereby reducing the total amount of energy consumed by the semiconductor device 2.

Further, when the second memory 310 and the third memory 320 storing the drive data share a die with the processor core 100, the size of the semiconductor device 2 may be reduced, and the amount of electric power consumed by the semiconductor device 2 may be reduced. In particular, when the semiconductor device 2 is a device (e.g., a smart refrigerator equipped with a display, a voice recognition module or the like) to which the IoT operation is applied, the IoT device, which has a small size and may be used for a long time, can improve the user's satisfaction.

Figure 8:
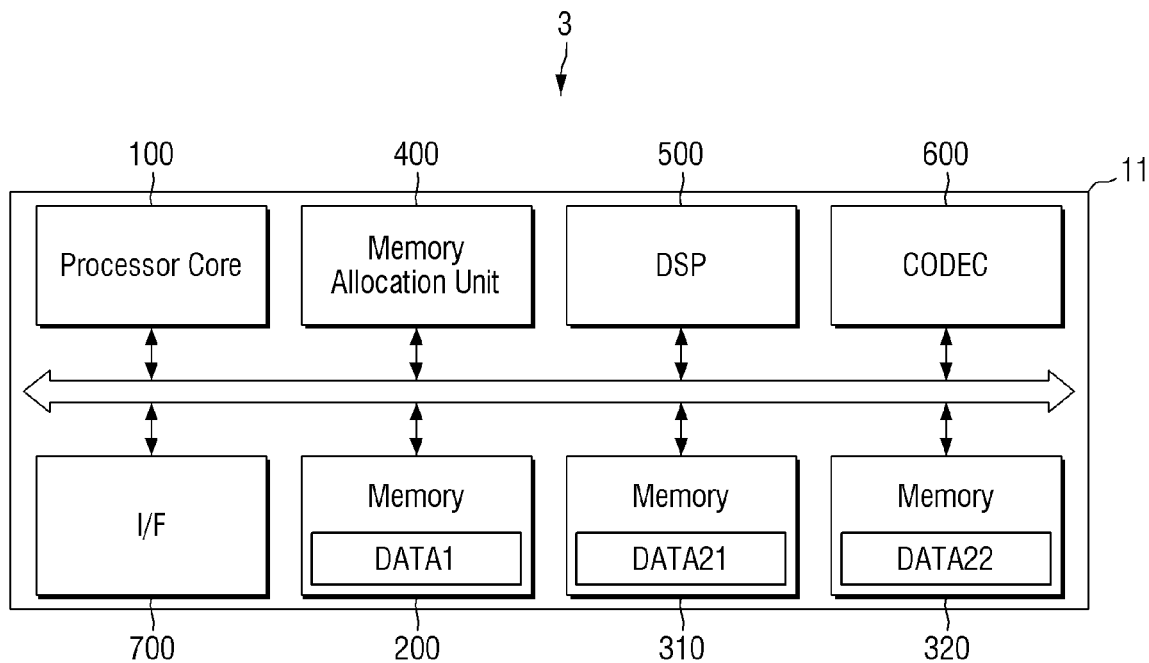
FIG. 8 is a block diagram illustrating a process of executing a program operation, according to an example embodiment.

FIG. 8 is a block diagram illustrating a process of executing a program processing operation, according to an example embodiment.

Referring to FIG. 8, a semiconductor device 3 according to an example embodiment may include a processor core 100, a first memory 200, a second memory 310, a third memory 320, a memory allocation unit 400, a DSP 500 (digital signal processor), a codec 600, and an interface module 700. The processor core 100, the first memory 200, the second memory 310, and the third memory 320 may be configured similarly to FIG. 7, and the program data processing operation of the semiconductor device 1 described with reference to FIGS. 1 and 6 may also be similarly applied to the semiconductor device 3.

The memory allocation unit 400 may allocate a memory in which the program data is stored under the control of the processor core 100. For example, when the attributes of the three program data types are decided as stack data (e.g., the first data DATA1), the code data (e.g., the second data DATA21) and the heap data (e.g., the third data DATA22) by the processor core 100, the memory allocation unit 400 may allocate the memory such that the program data is stored in the first memory 200, the second memory 310, and the third memory 320.

The DSP 500 may electrically connect an external microphone (not illustrated) or a display (not illustrated) to the processor core 100. According to an example embodiment, it is possible to acquire a voice signal among audio signals input from the outside, and to execute the digital signal processing operation of the acquired signal. According to the example embodiment, the processor core 100 may execute the program operation, using the signal processed by the DSP 500 and the program data.

The codec 600 may perform encoding/coding or decoding of video data or voice data that is input from the outside.

The interface module 700 may set communication between, for example, a semiconductor device 3 and an external device (not illustrated) or a server (not illustrated). For example, the interface module 700 may be connected to the network via wireless or wired communication to communicate with external devices or servers.

Figure 9:
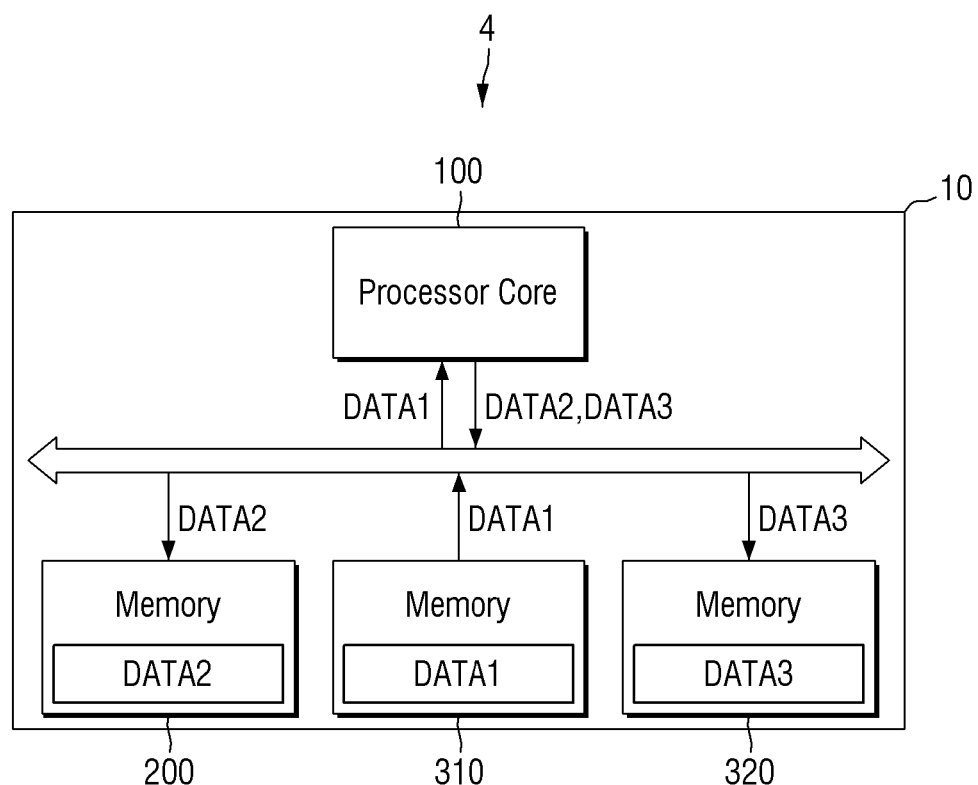
FIG. 9 is a block diagram illustrating the program operation using two same types of memories and one different type of memory, according to an example embodiment.
Figure 10:
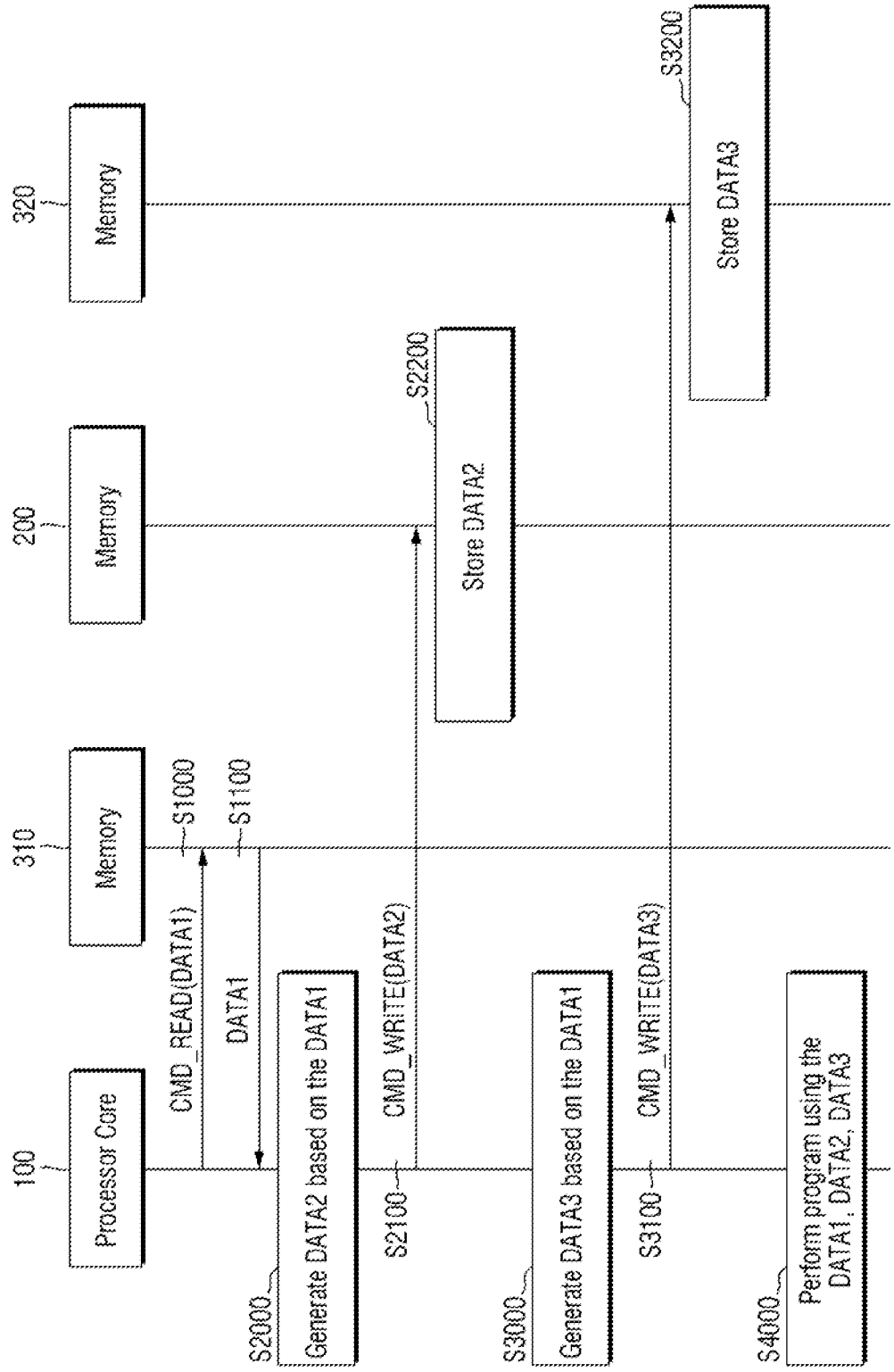
FIG. 10 is a flowchart illustrating the example program operation of FIG. 9.

FIG. 9 is a block diagram illustrating the program operation using two same types of memories and one different type of memory according to an example embodiment, and FIG. 10 is a block diagram illustrating the program operation of FIG. 9.

Referring to FIG. 9, a semiconductor device 4 according to an example embodiment may include a processor core 100 mounted on the first semiconductor chip 10 to execute the program operation, a first memory 200 mounted on the first semiconductor chip 10 and storing data DATA2 used for program operation, a second memory 310 mounted on the first semiconductor chip 10 and having a memory cell of the type different from the memory cell included in the first memory 200, and a third memory 320 mounted on the first semiconductor chip 10 and having the memory cell of the same type as the memory cell included in the second memory 310. According to the embodiment, the processor core 100, the first memory 200, the second memory 310, and the third memory 320 may be configured similarly to the processor core 100, the first memory 200, the second memory 310, and the third memory 320 of FIG. 1, respectively. However, the present invention is not limited thereto and may be configured as different types of processor cores and/or different types of memories.

According to some example embodiments, the processor core 100 may selectively determine a memory in which data is stored based on the range of the virtual address region allocated to the data used for the program operation. For example, the processor core 100 may perform determinations such that the data DATA2 corresponding to the address included in the first address range is stored in the first memory 200, the first data DATA1 corresponding to the address included in the second address range is stored in the second memory 310, and the fourth data DATA3 corresponding to the address included in the third address range is stored in the third memory 320.

According to some embodiments, the processor core 100 may selectively allocate a first address range, a second address range, and a third address range in the order the data is generated, among the data used for program operation, may store data included in the second address range in the first memory 200, and may selectively store data included in the first address range and the third address range in the second memory 310 or the third memory 320. For example, when the first data DATA1 is generated first and the data DATA2 and the fourth data DATA3 are generated on the basis of the first data DATA1, the first data DATA1 may be stored in the second memory 310, the data DATA2 may be stored in the first memory 200, and the fourth data DATA3 may be stored in the third memory 320.

According to some example embodiments, the processor core 100 may allocate the first address range storing the code of the program operation, the second address range storing a local variable defined in the program operation, and the third address range that is dynamically allocated for dynamic variables of the program operation. At this time, data (e.g., the first data DATA1) included in the first address range may be stored in the second memory 310, and data (e.g., the data DATA2) included in the second address range and data (e.g., the fourth data DATA3) included in the third address range may be generated, on the basis of the first data DATA1. The processor core 100 may store the generated data DATA2 in the first memory 200, may store the generated fourth data DATA3 in the third memory 320, and may execute the program operation, using the first data DATA1, the data DATA2, and the fourth data DATA3.

Hereinafter, the process of executing the program operation using two same types of memories and one different type of memory will be described with reference to FIGS. 9 and 10. As described above, it is assumed that the second memory 310 and the third memory 320 are configured as the same type of memory, and the first memory 200 is configured as the memory different from the second memory 310 and the third memory 320.

In step S1000, the processor core 100 may transmit a read command CMD_READ(DATA1) of the first data DATA1 to the second memory 310. According to the example embodiment, it is assumed that the first data DATA1 is code data used for implementing the program operation, is generated at the time of the first program generation, and is stored in the second memory 310. In step S1100, the processor core 100 may read the first data DATA1 from the second memory 310.

In step S2000, the processor core 100 may generate data DATA2 based on the first data DATA1 received from the second memory 310. According to the example embodiment, the data DATA2 may be stack data of local variables, and may be generated based on the first data DATA1 which is the code data. In step S2100, the processor core 100 transmits the write command CMD_WRITE(DATA2) of the data DATA2 to the first memory 200, and the data DATA2 is stored in the first memory 200 in step S2200. For example, the code data (e.g., the first data DATA1) and the stack data (e.g., the data DATA2) necessary for program operation may be stored in memories different from each other.

In step S3000, the processor core 100 may generate the fourth data DATA3 based on the first data DATA1. According to the embodiment, the fourth data DATA3 may be data dynamically allocated after loading of the code data. As another example, the processor core 100 may generate the fourth data DATA3 based on at least one of the first data DATA1 and the data DATA2. In step S3100, the processor core 100 transmits a write command CMD_WRITE (DATA3) of the fourth data DATA3 to the third memory 320. In step S3200, the fourth data DATA3 is stored in the third memory 320. For example, the semiconductor device 4 according to an example embodiment may store the code data (e.g., the first data DATA1), the stack data (e.g., the data DATA2) and the heap data (e.g., the fourth data DATA3) in memories different from each other. Specifically, the code data and the heap data may be stored in different memories of the same type, and the stack data may be stored in a memory having a structure different from the memory in which the code data and the heap data are stored.

In step S4000, the processor core 100 may execute the program operation, using the first data DATA1 stored in the second memory 310, the data DATA2 stored in the first memory 200, and the fourth data DATA3 stored in the third memory 320.

Figure 11:
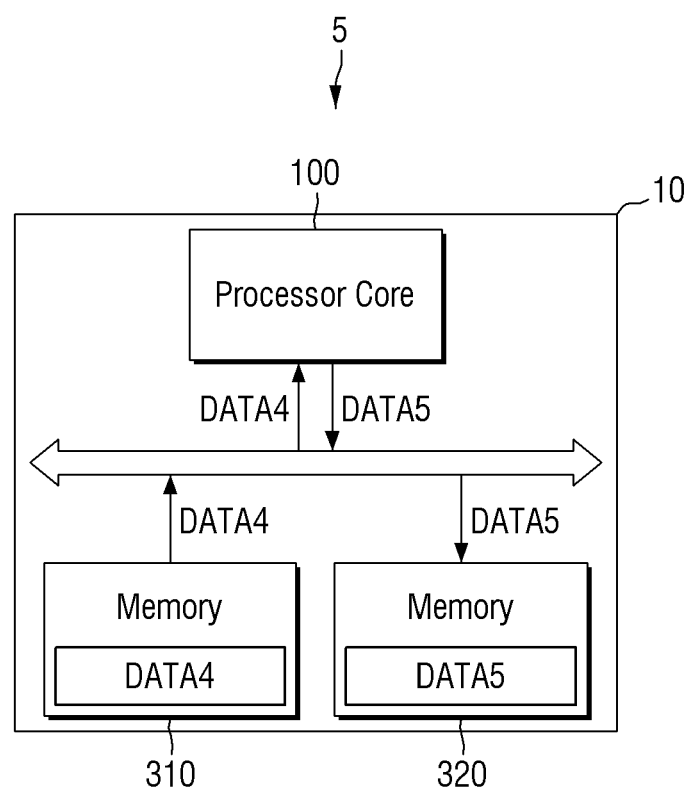
FIG. 11 is a block diagram illustrating the program operation, using two same types of memories, according to an example embodiment.
Figure 12:
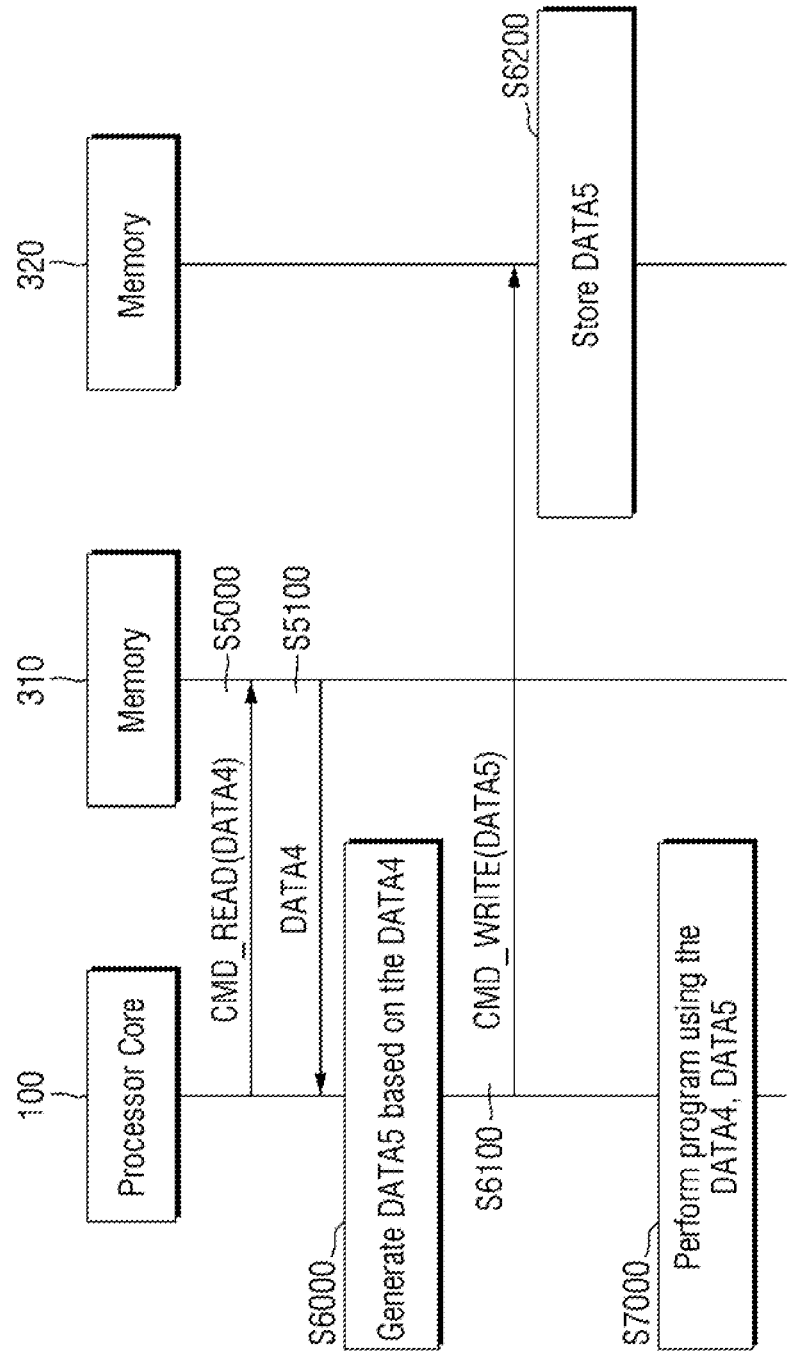
FIG. 12 is a flowchart illustrating the example program operation of FIG. 11.

FIG. 11 is a block diagram illustrating the program operation using two same memories according to an example embodiment, and FIG. 12 is a flowchart illustrating the program operation of FIG. 11.

Referring to FIG. 11, a semiconductor device 5 according to an example embodiment may include a processor core 100 for processing the program data, and a second memory 310 and a third memory 320 for processing the program data, and the second memory 310 and the third memory 320 may be configured as the same kind of memory. According to the example embodiment, the processor core 100, the second memory 310, and the third memory 320 may be mounted on the same semiconductor chip (e.g., the semiconductor chip 10).

According to the embodiment, the second memory 310 and the third memory 320 may be configured as MRAM, and at this time, the second memory 310 may have a first MTJ structure, and the third memory 320 may have a second MTJ structure. According to the example embodiment, the heights of the first MTJ structure and the second MTJ structure may be different from each other. The height of the MTJ structure may be sum of the vertical lengths of the pinned layer, the tunnel layer and the free layer included in each MTJ structure. For example, the height of the MTJ structure may mean the thickness in a direction in which the pinned layer 303, the tunnel layer 305 and the free layer 307 of the MTJ structure 302 illustrated in FIG. 2 are stacked.

According to the example embodiment, the second memory 310 may be the second memory 310 of FIG. 3a, and the third memory 320 may be one of the fourth memory 320_1 of FIG. 3c and the fifth memory 320_2 of FIG. 3d. For example, the height of the second MTJ structure of the third memory 320 may be higher than the height of the first MTJ structure of the second memory 310. For example, since the thickness of the free layer of the second MTJ structure is formed to be larger than the thickness of the free layer of the first MTJ structure, the height of the third memory 320 may be formed to be higher than the second memory 310. As another example, since the thickness of the tunnel layer of the second MTJ structure is formed to be larger than the thickness of the tunnel layer of the first MTJ structure, the height of the third memory 320 may be formed to be higher than the second memory 310.

According to some embodiments, the processor core 100 may determine the memory in which the data is stored based on the order in which the data is generated. For example, the processor core 100 reads the fifth data DATA4 generated at the time of generating the program and stored in the second memory 310, generates sixth data DATA5 based on the fifth data DATA4, stores the sixth data DATA5 in the third memory 320, and executes the program operation using the fifth data DATA4 and the sixth data DATA5. For example, the fifth data DATA4 generated earlier may be stored in the second memory 310, and the sixth data DATA5 generated later (or generated by calculation based on the data generated earlier) may be stored in the third memory 320.

According to some example embodiments, the processor core 100 generates the sixth data DATA5 while the program operation is executed, and deletes the sixth data DATA5 from the third memory 320 after the program operation is completed. For example, the fifth data may be data that is generated at the time of execution of the program and that is deleted data after the execution of the program is completed.

The process of executing the program operation using two same types of memories will be described below with reference to FIGS. 11 and 12. As described above, it is assumed that the second memory 310 and the third memory 320 are configured as the same kind of memory and include MTJ structures having different heights.

In step S5000, the processor core 100 may transmit the read command CMD_READ(DATA4) of the fifth data DATA4 to the second memory 310. According to the example embodiment, it is assumed that the fifth data DATA4 is data generated at the time of generating the first program and is stored in the second memory 310. In step S5100, the processor core 100 may read the fifth data DATA4 from the second memory 310.

In step S6000, the processor core 100 may generate the sixth data DATA5 based on the fifth data DATA4 received from the second memory 310. In step S6100, the processor core 100 transmits a write command CMD_WRITE (DATA5) of the sixth data DATA5 to the third memory 320, and the sixth data DATA5 is stored in the third memory 320 in step S3200. For example, the processor core 100 may decide the data stored in the same type of memories having different heights (e.g., the second memory 310 and the third memory 320) based on the attributes of the data. According to the example embodiments, the attributes of the data may be determined on the basis of before and after the data is generated. According to other embodiments, the attributes of the data may be determined based on the type of data (e.g., the code data, the stack data, and the heap data). According to other example embodiments, the attributes of the data may be decided based on the range of the virtual address that includes the virtual address assigned to the data.

In step S7000, the processor core 100 may execute the program operation, using the fifth data DATA4 and the sixth data DATA5. For example, the processor core 100 may execute the program operation, using the data stored in the same kind of memory having different heights (e.g., the second memory 310 and the third memory 320).

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A semiconductor device comprising:
   a processor core configured to process program data;
   a first memory including a first MTJ structure; and
   a second memory including a second MTJ structure having a height different from the first MTJ structure,
   wherein the processor core is further configured to read first data stored in the first memory, generate second data on the basis of the first data, store the second data in the second memory, and execute a program operation using the first data and the second data.

2. The semiconductor device of claim 1,
   wherein the second MTJ structure has a height higher than the first MTJ structure, and
   wherein the processor core is configured to generate the second data while the program operation is executing, and delete the second data from the second memory after the program operation is executed.

3. The semiconductor device of claim 1, further comprising:
   an SRAM configured to store third data to be processed by the processor core,
   wherein the processor core is further configured to generate the third data based on the first data, store the third data in the SRAM, and execute the program operation using the first data, the second data, and the third data.

4. The semiconductor device of claim 3,
   wherein the second MTJ structure has a height higher than the first MTJ structure, and
   wherein the processor core is further configured to delete each of the second data and the third data from the second memory and the SRAM, respectively, after the program operation is executed.

5. The semiconductor device of claim 3,
   wherein the attribute of the first data is RO (Read Only) data, and the attribute of the second data and third data is RW (Read/Write) data.

6. The semiconductor device of claim 5,
   wherein the attribute of the second data is RI (Read Intensive) data, and the attribute of third data is WI (Write Intensive) data.

7. The semiconductor device of claim 3, wherein the attribute of the first data is code data, the attribute of the second data is heap data and the attribute of the third data is stack data.

8. The semiconductor device of claim 1,
   wherein each of the first MTJ structure and the second MTJ structure includes a pinned layer, a tunnel layer, and a free layer, and
   wherein the first MTJ structure and the second MTJ structure are formed so that at least one of a cross-sectional area, a thickness of the tunnel layer, and a thickness of the free layer differs between the first MTJ structure and the second MTJ structure.

9. The semiconductor device of claim 8, wherein a cross-sectional area of the second MTJ structure is formed to be larger than a cross-sectional area of the first MTJ structure.

10. The semiconductor device of claim 8, wherein a thickness of the tunnel layer of the second MTJ structure is formed to be larger than a thickness of the tunnel layer of the first MTJ structure.

11. The semiconductor device of claim 8, wherein a thickness of the free layer of the second MTJ structure is formed to be larger than a thickness of the free layer of the first MTJ structure.

12. A semiconductor device comprising:
a processor core mounted on a first semiconductor chip and configured to execute a program operation;
a first memory mounted on the first semiconductor chip and configured to store data used for the program operation;
a second memory mounted on the first semiconductor chip and having a first MTJ structure different from a memory cell included in the first memory; and
a third memory mounted on the first semiconductor chip and including a second MTJ structure having a height different from the first MTJ structure,
wherein the processor core is further configured to selectively determine a memory in which data is stored based on a range of a virtual address region allocated to data used for the program operation.

13. The semiconductor device of claim 12,
wherein the processor core is further configured to allocate a first address range, a second address range, and a third address range, in an order of previously generated data, among data used in the program operation, and
wherein the processor core is further configured to store data included in the second address range in the first memory, and to selectively stores data, which are included in the first address range and the third address range, in the second memory or the third memory.

14. The semiconductor device of claim 12,
wherein the processor core is further configured to allocate a first address range for storing a code of the program operation, a second address range for storing a local variable defined in the program operation, and a third address range dynamically allocated for a dynamic variable in the program operation,
the processor core is further configured to store first data, which is included in the first address range, in the second memory, generate second data included in the second address range and third data included in the third address range based on the first data, store the second data in the first memory, store the third data in the third memory, and execute the program operation, using the first data, the second data, and the third data.

15. The semiconductor device of claim 14, wherein the attribute of the first data is RO (Read Only) data, and the attribute of the second data, the attribute of the second data is WI (Write Intensive) data, and the attribute of the third data is RI (Read Intensive) data.

16. The semiconductor device of claim 12, wherein the first memory is a static random access memory (SRAM).

17. The semiconductor device of claim 16, wherein the second MTJ structure has a height higher than the first MTJ structure.

18. A semiconductor device comprising:
a processor core mounted on a semiconductor chip and configured to process program data;
a first memory mounted on the semiconductor chip;
a second memory including a magneto-resistive random access memory (MRAM) cell having a first Magnetic Tunnel Junction (MTJ) structure; and
a third memory including an MRAM cell having a second MTJ structure different from the first MTJ structure,
wherein the processor core determines an attribute of the program data based on an order stored in a memory, among a plurality of program data required when executing one program operation, and
wherein the processor core sequentially stores the program data in the second memory, the first memory, and the third memory in accordance with the order stored in the memory.

19. The semiconductor device of claim 18,
wherein each of the first MTJ structure and the second MTJ structure includes a pinned layer, a tunnel layer, and a free layer, and
wherein the first MTJ structure and the second MTJ structure are formed so that the second MTJ structure is formed to be larger than the first MTJ structure in at least one of a cross-sectional area, a thickness of the tunnel layer, and a thickness of the free layer.

20. The semiconductor device of claim 18, wherein the second memory and the third memory are mounted on the semiconductor chip with the first memory.

* * * * *